(12) United States Patent
Takashima et al.

(10) Patent No.: US 10,833,098 B2
(45) Date of Patent: Nov. 10, 2020

(54) SEMICONDUCTOR MEMORY DEVICE AND METHOD FOR MANUFACTURING THE SAME WITH INCREASED STORAGE CAPACITY

(71) Applicant: TOSHIBA MEMORY CORPORATION, Minato-ku (JP)

(72) Inventors: Akira Takashima, Fuchu (JP); Tsunehiro Ino, Fujisawa (JP); Yuuichi Kamimuta, Yokkaichi (JP); Ayaka Suko, Yokohama (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 16/299,727

(22) Filed: Mar. 12, 2019

(65) Prior Publication Data

US 2019/0319043 A1 Oct. 17, 2019

(30) Foreign Application Priority Data

Apr. 12, 2018 (JP) ................. 2018-077183

(51) Int. Cl.
*H01L 27/11582* (2017.01)
*H01L 29/51* (2006.01)
(Continued)

(52) U.S. Cl.
CPC .... *H01L 27/11582* (2013.01); *H01L 21/0217* (2013.01); *H01L 21/02164* (2013.01);
(Continued)

(58) Field of Classification Search
CPC . H01L 51/56; H01L 51/5253; H01L 51/5016; H01L 51/5056; H01L 27/3244
(Continued)

(56) References Cited

U.S. PATENT DOCUMENTS 7,709,883 B2 5/2010 Takano et al.
7,858,464 B2 12/2010 Chae et al.
(Continued)

FOREIGN PATENT DOCUMENTS

JP 2008-010842 1/2008
JP 2008-078504 4/2008
JP 2010-074096 4/2010

OTHER PUBLICATIONS

G. Molas, et al., "Investigation of charge-trap memories with AlN based band engineered storage layers", Solid-State Electronics 58, 2011, 7 pages.

*Primary Examiner* — Andy Huynh
(74) *Attorney, Agent, or Firm* — Oblon, McClelland, Maier & Neustadt, L.L.P.

(57) ABSTRACT

According to one embodiment, a semiconductor memory device includes a first conductive member, a first semiconductor member, and a first stacked member provided between the first conductive member and the first semiconductor member. The first stacked member includes a first insulating film, a second insulating film provided between the first insulating film and the first semiconductor member, first and second layers. The first layer includes aluminum and nitrogen and is provided between the first and second insulating films. A first thickness of the first layer along a first direction is 3 nm or less. The first direction is from the first semiconductor member toward the first conductive member. The second layer contacts the first layer, includes silicon and nitrogen, and is provided at one of a position between the first layer and the second insulating film or a position between the first layer and the first insulating film.

15 Claims, 9 Drawing Sheets

(51) Int. Cl.
*H01L 29/423* (2006.01)
*H01L 21/02* (2006.01)
*H01L 29/10* (2006.01)
*H01L 21/28* (2006.01)

(52) U.S. Cl.
CPC .. *H01L 21/02178* (2013.01); *H01L 21/02271* (2013.01); *H01L 29/1037* (2013.01); *H01L 29/40117* (2019.08); *H01L 29/4234* (2013.01); *H01L 29/513* (2013.01); *H01L 29/518* (2013.01)

(58) Field of Classification Search
USPC ....................................................... 257/324
See application file for complete search history.

(56) References Cited

U.S. PATENT DOCUMENTS

| | | |
|---|---|---|
| 7,989,876 B2 | 8/2011 | Yasuda |
| 8,030,701 B2 | 10/2011 | Yasuda |
| 9,620,366 B2 | 4/2017 | Nakao et al. |
| 10,153,164 B2 | 12/2018 | Nakao et al. |
| 2009/0134450 A1 | 5/2009 | Kim et al. |
| 2010/0309729 A1 | 12/2010 | Chang et al. |
| 2016/0343657 A1* | 11/2016 | Sawa ................ H01L 29/40117 |
| 2017/0062465 A1* | 3/2017 | Yamashita ........ H01L 27/11565 |
| 2018/0108664 A1 | 4/2018 | Lee et al. |

\* cited by examiner

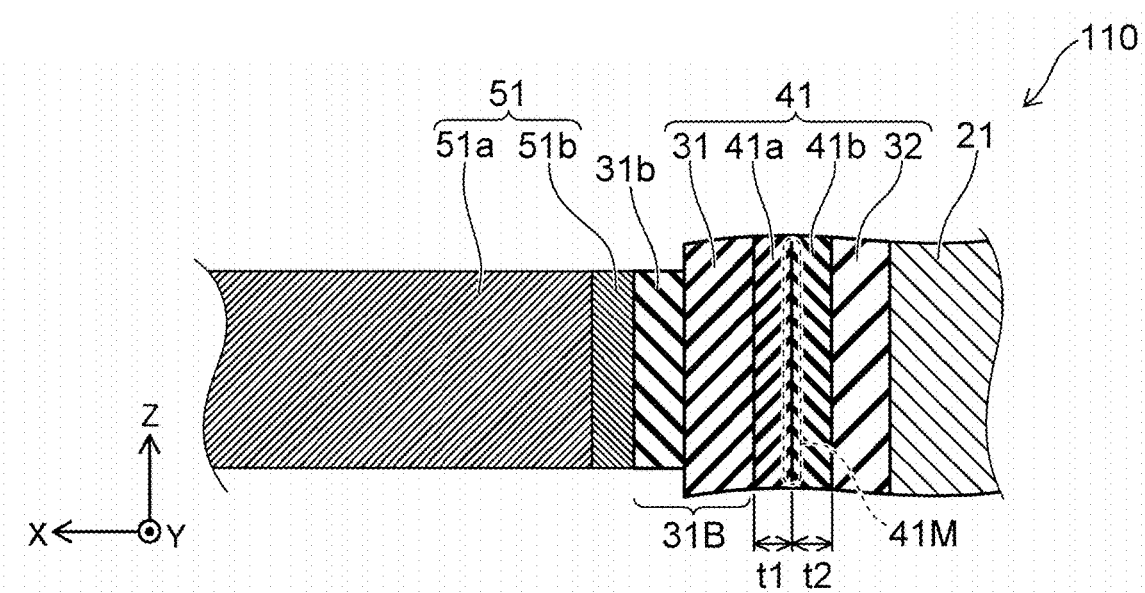
FIG. 1
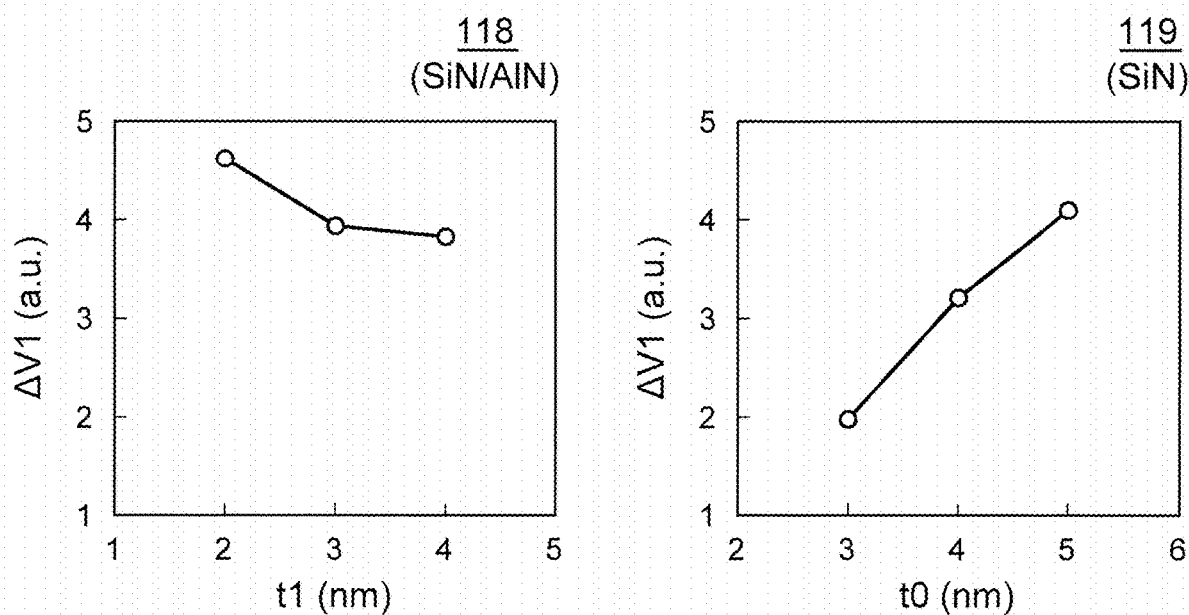
FIG. 2A
FIG. 2B t1=2nm t1=3nm t1=4nm

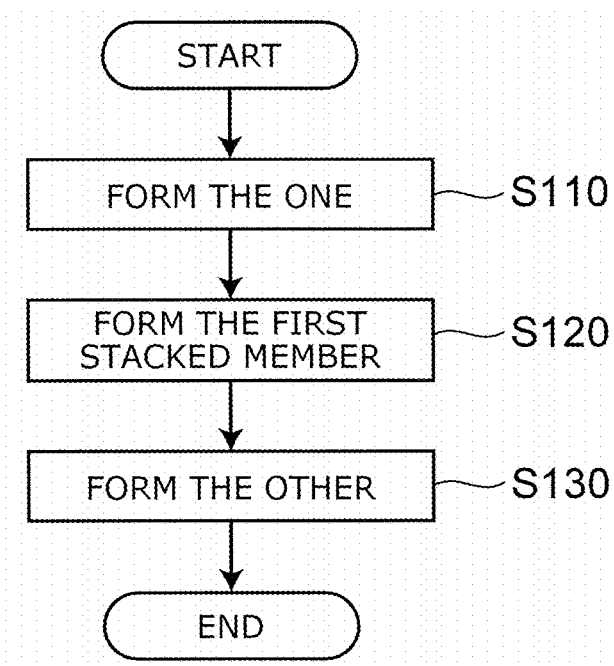
FIG. 11
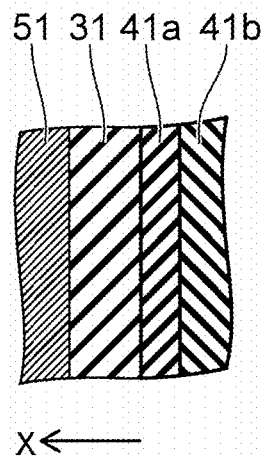
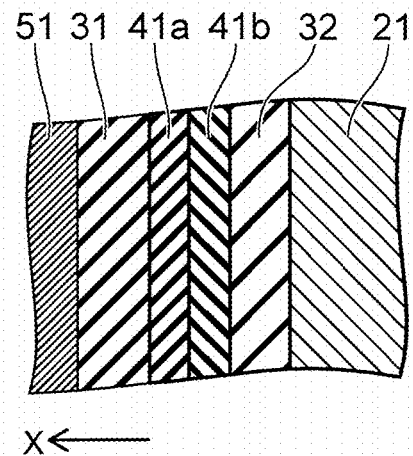
FIG. 12A  FIG. 12B

US 10,833,098 B2

SEMICONDUCTOR MEMORY DEVICE AND METHOD FOR MANUFACTURING THE SAME WITH INCREASED STORAGE CAPACITY

CROSS-REFERENCE TO RELATED APPLICATIONS

This application is based upon and claims the benefit of priority from Japanese Patent Application No. 2018-077183, filed on Apr. 12, 2018; the entire contents of which are incorporated herein by reference.

FIELD

Embodiments described herein relate generally to a semiconductor memory device and a method for manufacturing the same.

BACKGROUND

It is desirable to increase the storage density of a semiconductor memory device.

BRIEF DESCRIPTION OF THE DRAWINGS

FIG. 1 is a schematic cross-sectional view illustrating a semiconductor memory device according to a first embodiment;

FIG. 2A and FIG. 2B are graphs illustrating characteristics of the semiconductor memory devices;

FIG. 11 is a flowchart illustrating a method for manufacturing a semiconductor memory device according to a fourth embodiment; and FIG. 12A and FIG. 12B are schematic cross-sectional views illustrating the method for manufacturing the semiconductor memory device according to the fourth embodiment.

DETAILED DESCRIPTION

Figure 3A:
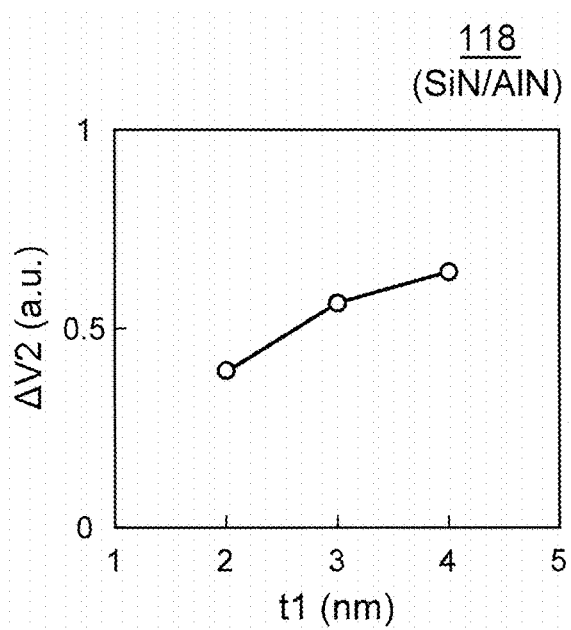
FIG. 3A and FIG. 3B are graphs illustrating characteristics of the semiconductor memory devices.

According to one embodiment, a semiconductor memory device includes a first conductive member, a first semiconductor member, and a first stacked member provided between the first conductive member and the first semiconductor member. The first stacked member includes a first insulating film, a second insulating film provided between the first insulating film and the first semiconductor member, a first layer, and a second layer. The first layer includes aluminum and nitrogen and is provided between the first insulating film and the second insulating film. A first thickness of the first layer along a first direction is 3 nm or less. The first direction is from the first semiconductor member toward the first conductive member. The second layer contacts the first layer, includes silicon and nitrogen, and is provided at one of a position between the first layer and the second insulating film or a position between the first layer and the first insulating film. The drawings are schematic and conceptual; and the relationships between the thickness and width of portions, the proportions of sizes among portions, etc., are not necessarily the same as the actual values thereof. Further, the dimensions and proportions may be illustrated differently among drawings, even for identical portions.

Various embodiments are described below with reference to the accompanying drawings.

The drawings are schematic and conceptual; and the relationships between the thickness and width of portions, the proportions of sizes among portions, etc., are not necessarily the same as the actual values thereof. Further, the dimensions and proportions may be illustrated differently among drawings, even for identical portions.

In the specification and drawings, components similar to those described previously or illustrated in an antecedent drawing are marked with like reference numerals, and a detailed description is omitted as appropriate.

First Embodiment

FIG. 1 is a schematic cross-sectional view illustrating a semiconductor memory device according to a first embodiment.

As shown in FIG. 1, the semiconductor memory device 110 according to the embodiment includes a first conductive member 51, a first semiconductor member 21, and a first stacked member 41. The first stacked member 41 is provided between the first conductive member 51 and the first semiconductor member 21.

The first stacked member 41 includes a first insulating film 31, a second insulating film 32, a first layer 41a, and a second layer 41b.

The second insulating film 32 is provided between the first insulating film 31 and the first semiconductor member 21. The first layer 41a is provided between the first insulating film 31 and the second insulating film 32. The second layer 41b is provided at one of a position between the first layer 41a and the second insulating film 32 or a position between the first layer 41a and the first insulating film 31. In the example, the second layer 41b is provided between the first layer 41a and the second insulating film 32.

The first layer 41a includes aluminum and nitrogen. The first layer 41a includes, for example, AlN. The first layer 41a may include silicon in addition to aluminum and nitrogen. The second layer 41b includes silicon and nitrogen. The second layer 41b includes SiN. The second layer 41b contacts the first layer 41a. For example, the second layer 41b is formed continuously with the first layer 41a.

In the example, the first conductive member 51 includes a first conductive portion 51a and a second conductive portion 51b. The second conductive portion 51b is provided between the first conductive portion 51a and the first insulating film 31. The first conductive portion 51a includes, for example, tungsten. The second conductive portion 51b includes, for example, TiN. For example, the second conductive portion 51b functions as a barrier metal. Examples of the materials of the first conductive portion 51a and the second conductive portion 51b are described below.

The first semiconductor member 21 includes, for example, silicon.

The first insulating film 31 and the second insulating film 32 include, for example, silicon and oxygen. The first insulating film 31 and the second insulating film 32 include, for example, $SiO_2$ regions. The first insulating film 31 and the second insulating film 32 may include, for example, SiON regions. At least portions of the first insulating film 31 and the second insulating film 32 may include, for example, aluminum and oxygen.

One transistor (memory portion) is formed of the first conductive member 51, the first semiconductor member 21, and the first stacked member 41. For example, the first semiconductor member 21 functions as a channel. For example, the first conductive member 51 functions as a control electrode. For example, the first insulating film 31 functions as at least a portion of a blocking insulating film. For example, the second insulating film 32 functions as a tunneling insulating film. For example, the first layer 41a and the second layer 41b function as a charge storage layer.

An insulating film 31b is further provided in the example. The insulating film 31b is provided between the first conductive member 51 and the first insulating film 31. The insulating film 31b includes aluminum oxide; and the first insulating film 31 includes silicon oxide. A stacked film of the insulating film 31b and the first insulating film 31 functions as a blocking insulating film 31B.

In one example, the first insulating film 31, the first layer 41a, the second layer 41b, and the second insulating film 32 are formed in this order. For example, the formation of these films and layers is performed by CVD, etc.

The direction from the first semiconductor member 21 toward the first conductive member 51 is taken as a first direction. The first direction is taken as an X-axis direction. A direction perpendicular to the X-axis direction is taken as a Z-axis direction. A direction perpendicular to the X-axis direction and the Z-axis direction is taken as a Y-axis direction.

The thickness of the first layer 41a along the first direction (the X-axis direction) is taken as a first thickness t1. The thickness of the second layer 41b along the first direction is taken as a second thickness t2. In the embodiment, the first thickness t1 is, for example, 3 nm or less.

As described below, it was found that a good window of the operating voltage is obtained by using such a first layer 41a (e.g., the AlN film) and the second layer 41b (e.g., the SiN film).

Also, it was found that good retention characteristics are obtained.

An experiment performed by the inventor will now be described.

Multiple samples are made in the experiment. In first to third samples, the first stacked member 41 has the configuration of the first semiconductor member 21/second insulating film 32/second layer 41b/first layer 41a/first insulating film 31/first conductive member 51. In the first to third samples, the first semiconductor member 21 is silicon; the second insulating film 32 is a $SiO_2$ film; the first insulating film 31 is a $SiO_2$ film; and the first conductive member 51 is, for example, a stacked film of TiN and tungsten.

In the first sample, the first layer 41a is an AlN film in which the first thickness t1 is 2 nm; and the second layer 41b is a SiN film in which the second thickness t2 is 3 nm.

In the second sample, the first layer 41a is an AlN film in which the first thickness t1 is 3 nm; and the second layer 41b is a SiN film in which the second thickness t2 is 2 nm.

In the third sample, the first layer 41a is an AlN film in which the first thickness t1 is 4 nm; and the second layer 41b is a SiN film in which the second thickness t2 is 1 nm.

In the first to third samples, the first layer 41a and the second layer 41b are formed continuously.

"Other samples" are made as a reference example. The "other samples" are the first to third samples recited above in which a single-layer SiN film (a charge storage film) is provided instead of the stacked film of the first layer 41a and the second layer 41b. In the "other samples," the thickness of the SiN film (the charge storage film) is modified. The window of the operating voltage and the retention characteristics are evaluated for such samples.

FIG. 2A and FIG. 2B are graphs illustrating characteristics of the semiconductor memory devices.

These figures illustrate measurement results of the window of the operating voltage. FIG. 2A corresponds to the first to third samples (the sample 118) recited above. In FIG. 2A, the horizontal axis is the first thickness t1 (nm). FIG. 2B corresponds to the other sample 119 recited above. In FIG. 2B, the horizontal axis is a thickness t0 (the thickness along the X-axis direction) of the SiN film. In these figures, the vertical axis is a window $\Delta V1$ of the operating voltage. The window $\Delta V1$ of the operating voltage is the difference between the threshold and the neutral threshold when programming. The window $\Delta V1$ is displayed as being normalized. The window of the operating voltage is large when the window $\Delta V1$ is large.

As shown in FIG. 2B, for the sample 119 in which the charge storage film is the single-layer SiN film, the maximum value of the window $\Delta V1$ is about "4" (when the thickness t0 is 5 nm). For the sample 119, the window increases as the thickness t0 increases.

As shown in FIG. 2A, it was found that compared to the sample 119, a large window $\Delta V1$ is obtained for the sample 118 in which the first layer 41a and the second layer 41b recited above are used as the charge storage film. The large window $\Delta V1$ is obtained for the sample 118 in which the first layer 41a and the second layer 41b are used; therefore, it is considered that the effect of the first layer 41a which is AlN is large.

Here, by comparing using the perspective of EOT (Effective Oxide Thickness), the EOT when the first thickness t1 of the sample 118 is 2 nm substantially matches the EOT when the thickness t0 of the sample 119 is 3.2 nm. Comparing FIG. 2A and FIG. 2B, the window $\Delta V1$ when the first thickness t1 of the sample 118 is 2 nm is larger than the window $\Delta V1$ when the thickness t0 of the sample 119 is 3.2 nm. Further, the EOT when the first thickness t1 of the sample 118 is 3 nm substantially matches the EOT when the thickness t0 of the sample 119 is 4.5 nm. Comparing FIG. 2A and FIG. 2B, in this case as well, the window $\Delta V1$ when the first thickness t1 of the sample 118 is 3 nm is larger than the window $\Delta V1$ when the thickness t0 of the sample 119 is 4.5 nm. Thus, by comparing for the same EOT, it can be seen that a large window $\Delta V1$ is obtained for the sample 118 in which the first layer 41a and the second layer 41b are used. Therefore, it is considered that the effect of the first layer 41a which is AlN is large. It is also considered that a characteristic may occur in which the relative dielectric constant of a film is dependent on the crystalline state (or the amorphous state) of the film.

As described above in reference to FIG. 2B, for the sample 119, the window increases as the thickness t0 increases. It is considered that this is caused by the amount of traps inside the SiN film increasing due to the increase of the thickness t0 of the SiN film. For example, it is considered that for the SiN film, even when the thickness of the SiN film is changed, the film properties do not change much; and the trap density does not change much.

On the other hand, because the AlN film has a large effect on the increase of the window ΔV1, there are expectations that the window ΔV1 should increase similarly to the SiN film as the thickness of the AlN film is increased. However, as shown in FIG. 2A, the window ΔV1 increases as the first thickness t1 of the AlN film (the first layer 41a) decreases. Therefore, it is considered that the behavior of the AlN film is different from the behavior of the SiN film.

For example, it is considered that the trap density of the AlN film (the first layer 41a) increases because the film properties change as the first thickness t1 decreases. Therefore, it is considered that the total amount of the traps increases when the first thickness t1 decreases.

For example, it is considered that the crystallinity of the AlN film is high when the AlN film (the first layer 41a) is thick. It is considered that the crystallinity of the AlN film is easily affected by the SiN film (the second layer 41b) adjacent to the AlN film when the AlN film (the first layer 41a) is thin. Because the SiN film is amorphous, it is considered that the AlN film approaches amorphous as the AlN film (the first layer 41a) becomes thinner. It is considered that the increase of the window ΔV1 is related to such a change of the film properties.

For example, generally, an AlN film that has a thickness of 6 nm easily becomes a wurtzite-type crystal. Conversely, it is considered that the structure of the film is changed by setting the AlN film to be thin, i.e., about 3 nm or less. For example, dangling bonds increase for an amorphous film. Therefore, it is considered that the trap density increases. Thereby, it is considered that the charge trapping efficiency increases.

In the embodiment, the first thickness t1 of the AlN film (the first layer 41a) is, for example, 3 nm or less. Thereby, the large window ΔV1 is obtained. It is more favorable for the first thickness t1 to be 2 nm or less. Thereby, the large window ΔV1 is obtained stably and easily.

On the other hand, according to another experiment of the inventor, it was found that the window ΔV1 decreases when the first stacked member 41 includes oxygen. For example, in the case where the second layer 41b is formed after removing the sample from the chamber once after forming the first layer 41a, aluminum hydroxide forms easily on the surface of the first layer 41a. When the second layer 41b is formed subsequently, a region that includes oxygen forms at the interface between the first layer 41a and the second layer 41b. The oxygen moves into the first layer 41a; and aluminum oxide forms in the first layer 41a. The trapping performance of aluminum oxide is poor.

Conversely, it was found that oxygen is not incorporated easily in the case where the second layer 41b is formed continuously with the formation of the first layer 41a in a state in which a reduced-pressure atmosphere is maintained. Thereby, a low oxygen concentration in the first layer 41a can be maintained; and a high trap density is obtained.

Further, because a region that includes oxygen is not formed between the first layer 41a and the second layer 41b, it is considered that the first layer 41a is directly affected by the second layer 41b when the first thickness t1 of the first layer 41a is set to be thin. For example, it is considered that when the first thickness t1 is set to be thin, the change of the film properties of the first layer 41a is obtained stably and easily.

In the first stacked member 41 of the embodiment, the first layer 41a contacts the second layer 41b; and oxygen substantially is not incorporated. It is considered that the large window ΔV1 is obtained for the first stacked member 41 in this state by setting the first thickness t1 of the first layer 41a to be thin (e.g., 3 nm or less).

Figure 3B:
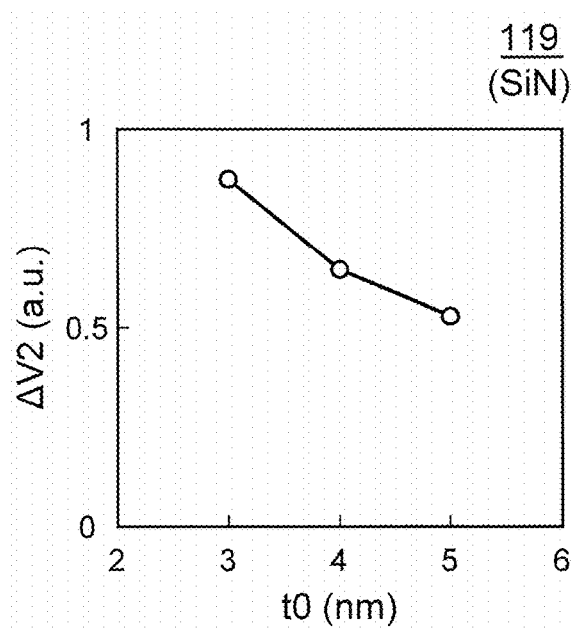

FIG. 3A and FIG. 3B are graphs illustrating characteristics of the semiconductor memory devices.

These figures illustrate measurement results of the retention characteristic. FIG. 3A corresponds to the first to third samples (the sample 118) recited above. In FIG. 3A, the horizontal axis is the first thickness t1 (nm). FIG. 3B corresponds to the other sample 119 recited above. In FIG. 3B, the horizontal axis is the thickness t0 of the SiN film. In these figures, the vertical axis is a retention characteristic ΔV2 (V). The retention characteristic ΔV2 corresponds to the difference (the fluctuation of the threshold voltage) between the threshold voltage directly after performing the program operation and the threshold voltage after a prescribed length of time has elapsed at a prescribed temperature after performing the program operation. When the retention characteristic ΔV2 is small, the fluctuation of the threshold voltage is small; and a stable storage operation is obtained.

For the sample 119 in which the charge storage film is the single-layer SiN film as shown in FIG. 3B, the minimum value of the retention characteristic ΔV2 is about "0.48" (when the thickness t0 is 5 nm).

For the sample 118 as shown in FIG. 3A, the value of the retention characteristic ΔV2 is "0.4" when the first thickness t1 is 2 nm (when the thickness provides the same EOT as when the thickness t0 of the sample 119 is 5 nm). Thus, it was found that compared to the sample 119, a good retention characteristic ΔV2 is obtained for the sample 118 in which the first layer 41a and the second layer 41b recited above are used as the charge storage film.

As shown in FIG. 3A, the retention characteristic ΔV2 improves when the first thickness t1 of the first layer 41a is small.

It is considered that the amorphous region increases when the first thickness t1 is small. It is considered that the density of the traps increases because the dangling bonds increase for the amorphous film. It is considered that the conduction inside the film is suppressed thereby. It is considered that the retention characteristic ΔV2 improves thereby.

For example, in the embodiment, the first thickness t1 is, for example, 3 nm or less. Thereby, the good retention characteristic ΔV2 is obtained. In the embodiment, the wide window ΔV1 and the good retention characteristic ΔV2 are obtained. In the embodiment, a good storage operation is obtained even in the case where the size of the memory cell is reduced. According to the embodiment, a semiconductor memory device can be provided in which the storage density can be increased.

Figure 4A:
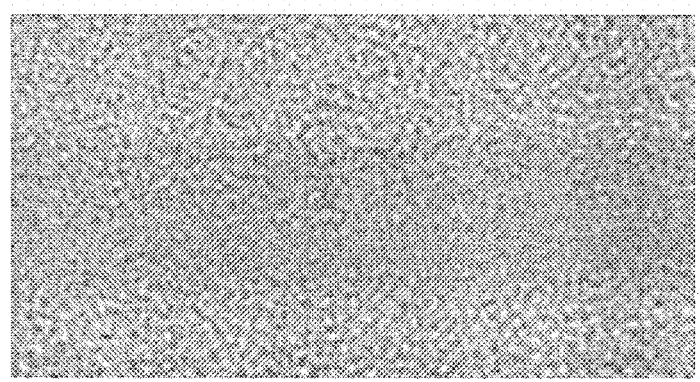
FIG. 4A to FIG. 4C are cross-section TEM images illustrating the semiconductor memory device.
Figure 4A:
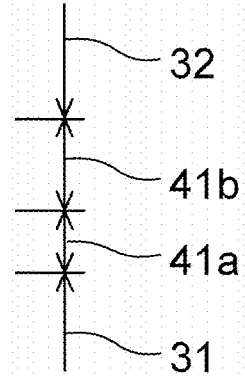
Figure 4B:
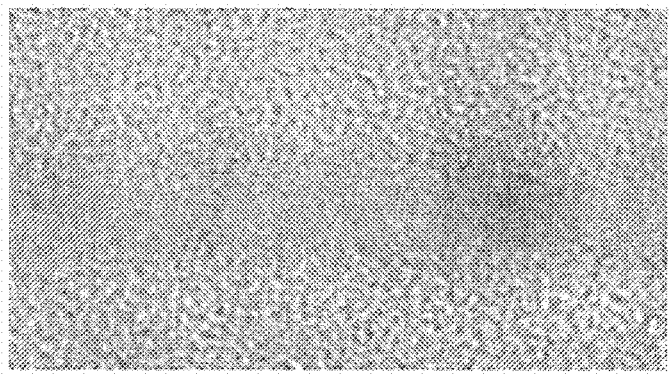
Figure 4B:
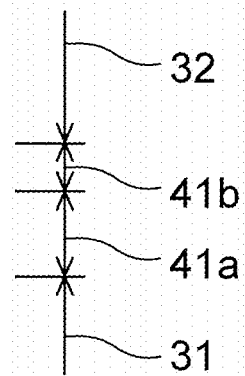
Figure 4C:
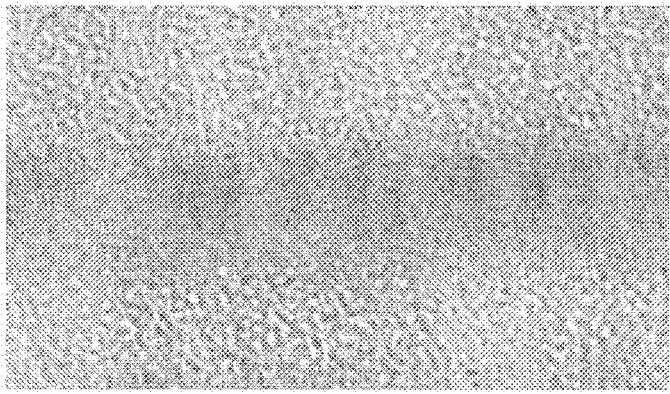
Figure 4C:
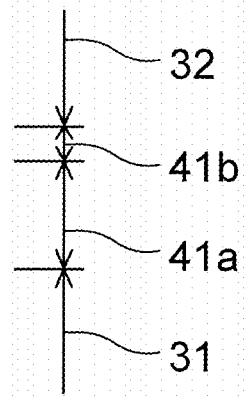

FIG. 4A to FIG. 4C are cross-section TEM images illustrating the semiconductor memory device.

FIG. 4A corresponds to the first sample in which the first thickness t1 is 2 nm. FIG. 4B corresponds to the second sample in which the first thickness t1 is 3 nm. FIG. 4C corresponds to the third sample in which the first thickness t1 is 4 nm.

As shown in these figures, the first layer 41a and the second layer 41b contact each other. The second layer 41b (the SiN film) is substantially amorphous. An amorphous portion and a crystalline portion are observed in the first layer 41a.

In the embodiment, at least a portion of the first layer 41a is amorphous. At least a portion of the second layer 41b is amorphous. The entire second layer 41b may be amorphous.

An intermediate region 41M that includes the boundary between the first layer 41a and the second layer 41b (referring to FIG. 1) does not include oxygen. Or, the concentration of oxygen in the intermediate region 41M is lower than the concentration of oxygen in the first insulating film 31. The concentration of oxygen in the intermediate region 41M is lower than the concentration of oxygen in the second insulating film 32. By setting the oxygen concentration in the intermediate region 41M including the first layer 41a and the second layer 41b to be low, for example, high trapping performance is obtained. For example, the concentration of oxygen in the intermediate region 41M is 1% or less. For example, the information relating to the concentration of oxygen is obtained by SIMS analysis, etc.

In the embodiment, it is favorable for the first thickness t1 to be 0.2 nm or more (substantially one atomic layer thick). In the case where the first thickness t1 is less than 0.2 nm, a uniform film is not obtained easily. In the case where the first thickness t1 is 0.2 nm or more, a uniform film is obtained easily. Stable characteristics are obtained easily.

In the embodiment, the second thickness t2 (the length along the first direction) of the second layer 41b is, for example, not less than 1 nm and not more than 4 nm. By setting the second thickness t2 to be 1 nm or more, for example, a uniform film is obtained easily. By setting the second thickness t2 to be 1 nm or more, for example, the film properties of the first layer 41a are controlled easily by the effect on the first layer 41a from the second layer 41b. The operating voltage is easily controlled appropriately when the second layer 41b is 4 nm or less.

The second layer 41b may further include aluminum in addition to silicon and nitrogen. The Al composition ratio in the second layer 41b may change. For example, the Al composition ratio in the second layer 41b may decrease in the direction from the first layer 41a toward the second layer 41b. In one example, the Al composition ratio in the second layer 41b may decrease in the direction from the first layer 41a toward the second insulating film 32. The decrease may be in stages or continuous.

For example, a region that includes aluminum nitride silicon may be formed between the first layer 41a and the second layer 41b. It is considered that by providing the composition of aluminum with a gradient, for example, the range where the traps exist is wider; and the traps are scattered. Thereby, the window ΔV1 is larger; and the retention characteristic improves further.

Second Embodiment

Figure 5:
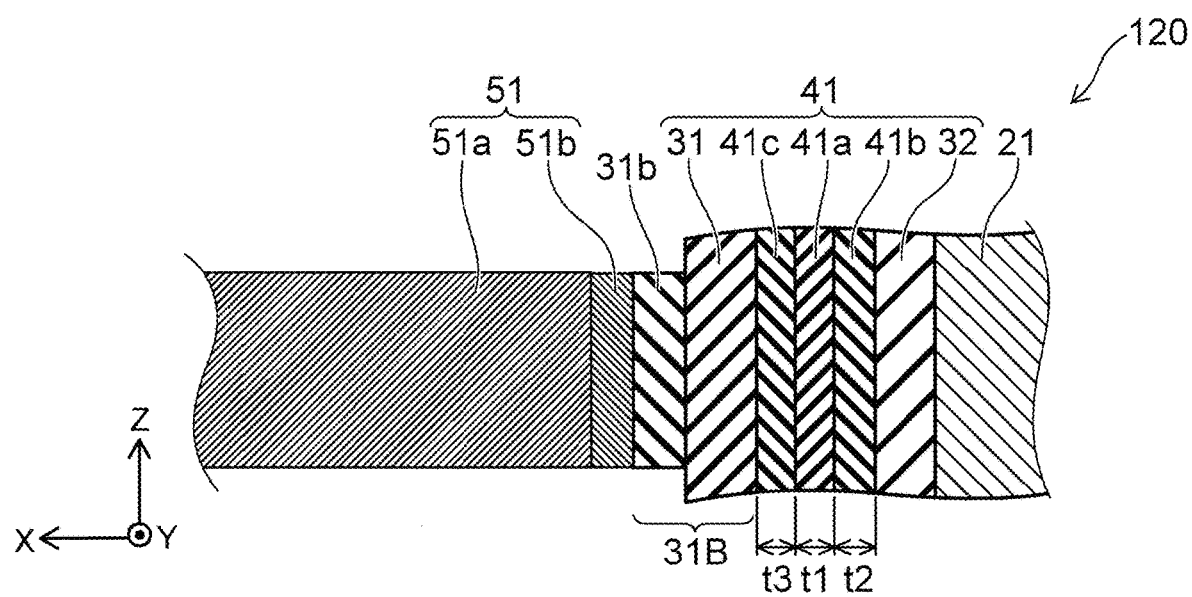
FIG. 5 is a schematic cross-sectional view illustrating a semiconductor memory device according to a first embodiment.

FIG. 5 is a schematic cross-sectional view illustrating a semiconductor memory device according to a first embodiment.

As shown in FIG. 5, the semiconductor memory device 120 according to the embodiment also includes the first conductive member 51, the first semiconductor member 21, and the first stacked member 41. In the semiconductor memory device 120, the first stacked member 41 further includes a third layer 41c in addition to the first insulating film 31, the second insulating film 32, the first layer 41a, and the second layer 41b. Otherwise, the configuration of the semiconductor memory device 120 is similar to the configuration of the semiconductor memory device 110.

The third layer 41c is provided at the other of the position between the first layer 41a and the second insulating film 32 or the position between the first layer 41a and the first insulating film 31. In the example, the third layer 41c is provided between the first insulating film 31 and the first layer 41a. The third layer 41c includes silicon and nitrogen. The third layer 41c is, for example, a SiN film.

A third thickness t3 (the length along the X-axis direction) of the third layer 41c is, for example, not less than 1 nm and not more than 3 nm.

In the semiconductor memory device 120, for example, the first layer 41a (e.g., the AlN film) is provided between the second layer 41b (e.g., the SiN film) and the third layer 41c (e.g., the SiN film). For example, the first layer 41a is affected by the two SiN films. Thereby, the first layer 41a is affected by the SiN films more easily when the first thickness t1 of the first layer 41a is thin. Thereby, a more stable charge storage operation is obtained. For example, a larger window ΔV1 is obtained. A better retention characteristic ΔV2 is obtained.

Figure 6:
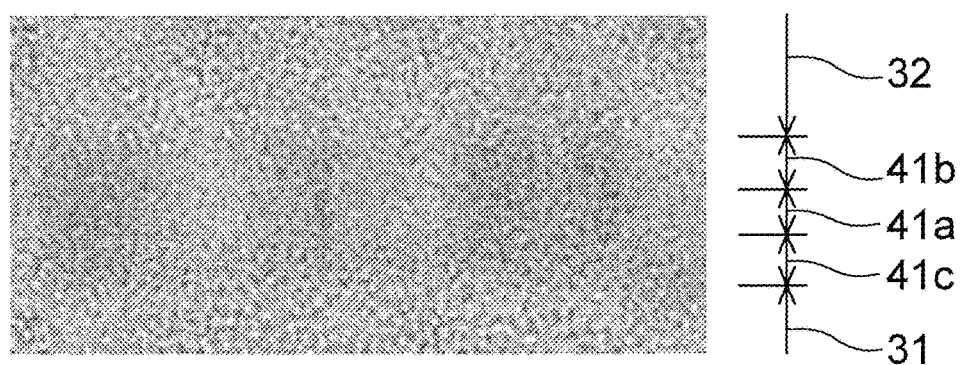
FIG. 6 is a cross-section TEM image illustrating the semiconductor memory device.

FIG. 6 is a cross-section TEM image illustrating the semiconductor memory device.

FIG. 6 illustrates a fourth sample corresponding to the semiconductor memory device 120. In the fourth sample, the third thickness t3 of the third layer 41c (the SiN film) is 2 nm; the first thickness t1 of the first layer 41a (the AlN film) is 1 nm; and the second thickness t2 of the SiN film (the second layer 41b) is 2 nm.

It can be seen from FIG. 6 that the first layer 41a is amorphous. The second layer 41b and the third layer 41c are amorphous. It is considered that the first layer 41a easily becomes amorphous by providing the first layer 41a between the amorphous second layer 41b and the amorphous third layer 41c. It is considered that because the AlN film is amorphous, it is easy to store the charge more efficiently.

In the embodiment, for example, by setting the first layer 41a to be thin, the film properties are changed; for example, the amorphous region is increased. It is considered that by interposing the first layer 41a between the two amorphous layers, the film properties are changed more easily.

For example, the first stacked member 41 may have a three-layer stacked structure of, for example, silicon nitride/ "aluminum nitride or aluminum nitride silicon"/silicon nitride. The first stacked member 41 may include multiple stacked structures; and one of the multiple stacked structures may include silicon nitride/"aluminum nitride or aluminum nitride silicon."

Figure 7:
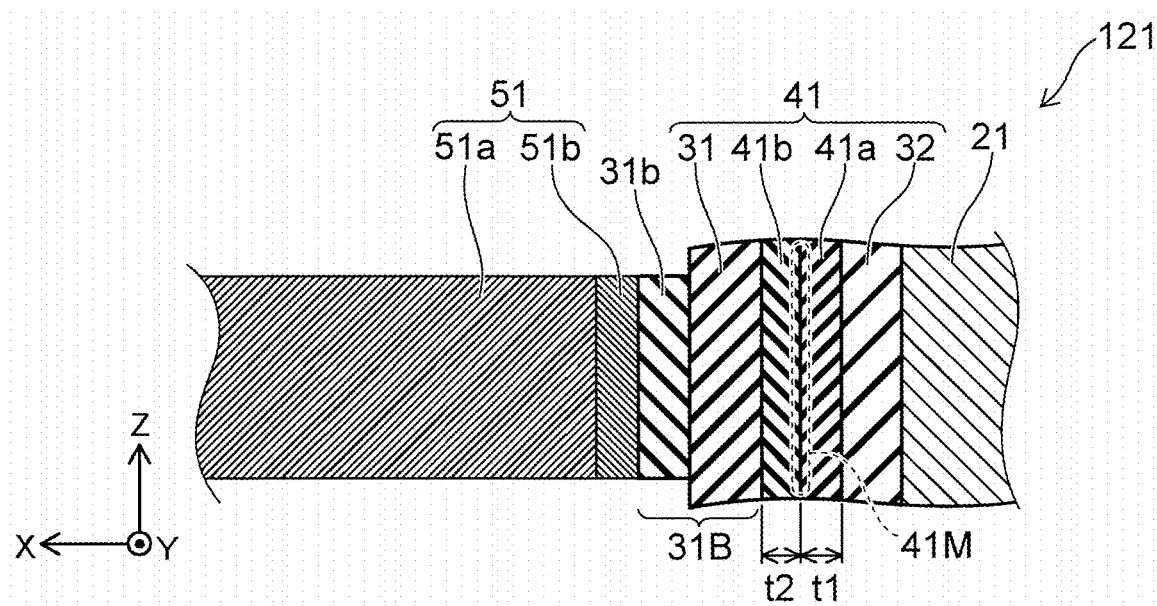
FIG. 7 is a schematic cross-sectional view illustrating a semiconductor memory device according to the first embodiment.

FIG. 7 is a schematic cross-sectional view illustrating a semiconductor memory device according to the first embodiment.

As shown in FIG. 7, the semiconductor memory device 121 according to the embodiment also includes the first conductive member 51, the first semiconductor member 21, and the first stacked member 41. The first stacked member 41 includes the first insulating film 31, the second insulating film 32, the first layer 41a, and the second layer 41b. In the semiconductor memory device 121, the positions of the first layer 41a and the second layer 41b are different from those of the semiconductor memory device 110. Otherwise, the configuration of the semiconductor memory device 121 is similar to the configuration of the semiconductor memory device 121.

In the semiconductor memory device 121, the second layer 41b is provided between the first layer 41a and the first insulating film 31. Thus, in the embodiment, for example, the second layer 41b may be provided at one of the position between the first layer 41a and the second insulating film 32 or the position between the first layer 41a and the first insulating film 31. In the semiconductor memory device 121 as well, a semiconductor memory device can be provided in which the storage density can be increased.

Third Embodiment

A third embodiment relates to three-dimensional memory.

Figure 8:
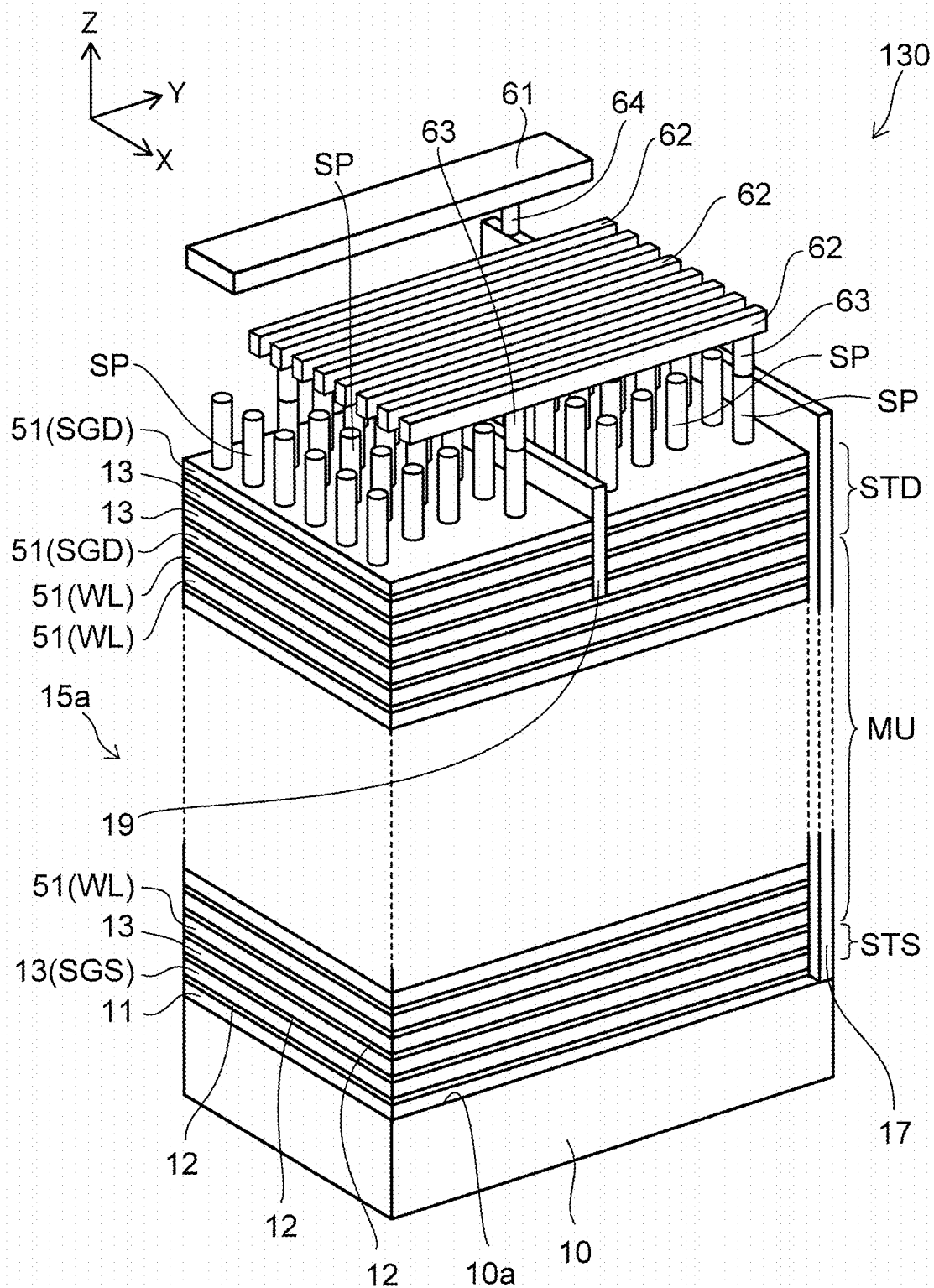
FIG. 8 is a schematic perspective view illustrating a semiconductor memory device according to a third embodiment.

FIG. 8 is a schematic perspective view illustrating a semiconductor memory device according to a third embodiment.

Figure 9A:
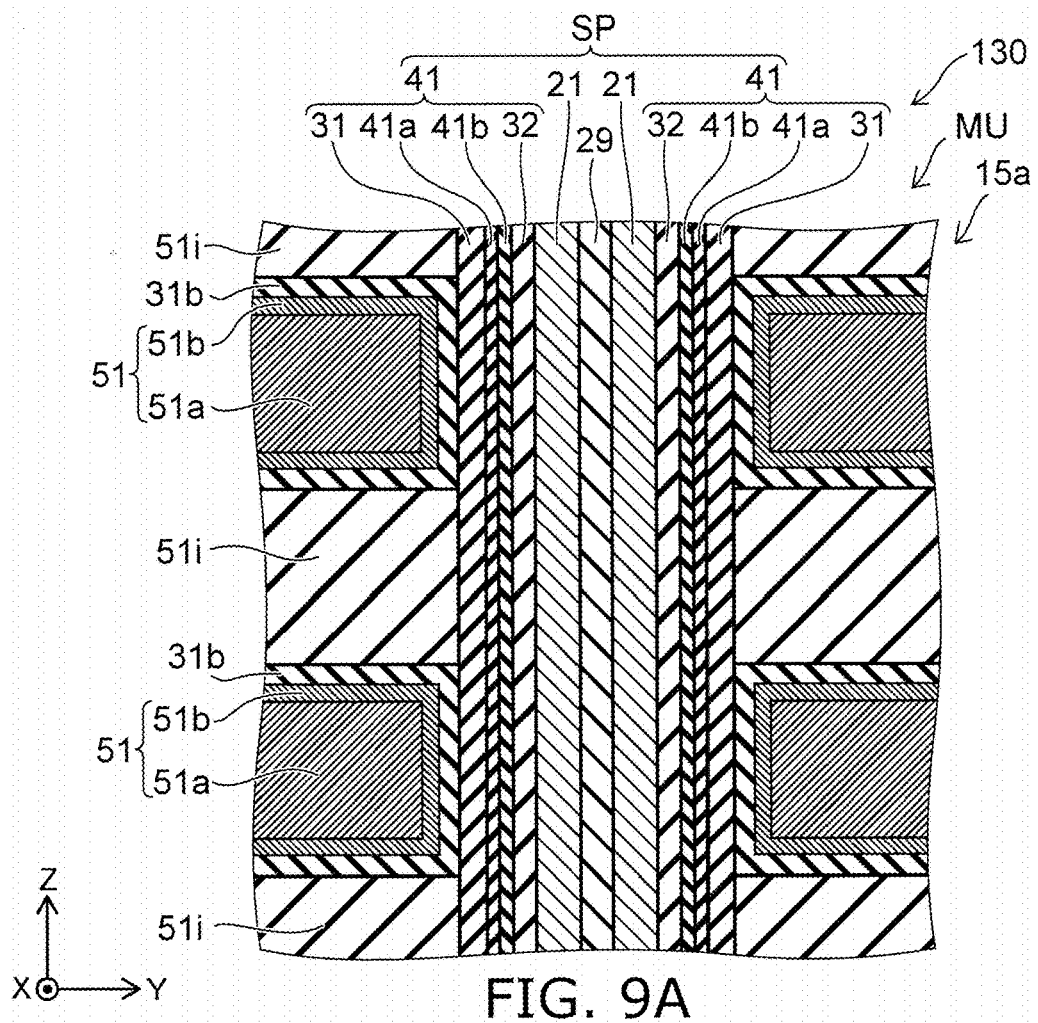
FIG. 9A and FIG. 9B are schematic cross-sectional views illustrating the semiconductor memory device according to the third embodiment.
Figure 9B:
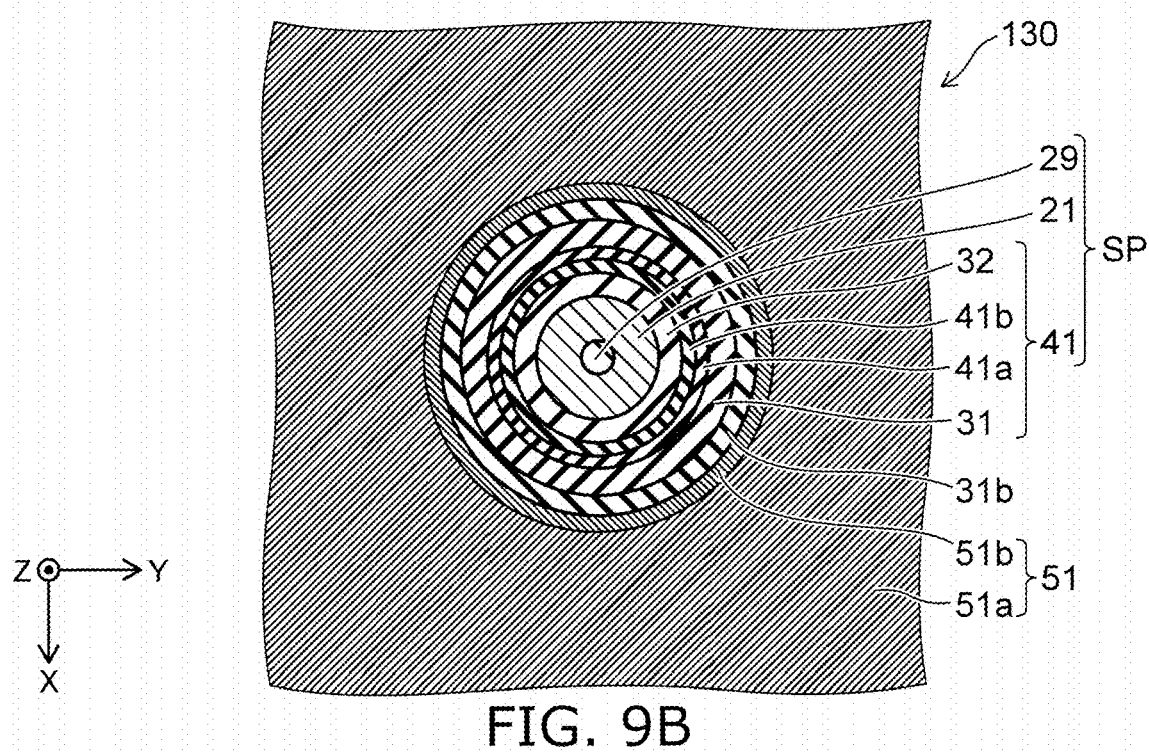

FIG. 9A and FIG. 9B are schematic cross-sectional views illustrating the semiconductor memory device according to the third embodiment.

FIG. 9A corresponds to a portion of a cross section along the Z-Y plane of FIG. 8. FIG. 9B corresponds to a portion of a cross section along the X-Y plane of FIG. 8. In the example, the first direction is taken as the X-axis direction.

As shown in FIG. 8, a first stacked body 15a is provided in the semiconductor memory device 130 according to the embodiment. The first stacked body 15a includes the multiple first conductive members 51. The multiple first conductive members 51 are separated from each other in the second direction. The second direction is taken as the Z-axis direction. As shown in FIG. 9A, the first conductive members 51 and first inter-layer insulating layers 51i are provided alternately in the first stacked body 15a. Multiple columnar members SP are provided as shown in FIG. 8. As shown in FIG. 9A and FIG. 9B, each of the multiple columnar members SP includes the first semiconductor member 21 and the first stacked member 41.

As shown in FIG. 9A and FIG. 9B, the first stacked member 41 is provided between the multiple first conductive members 51 and the first semiconductor member 21. One of the multiple columnar members SP (e.g., the first semiconductor member 21 and the first stacked member 41) extends along the second direction (the Z-axis direction) through the first stacked body 15a including the multiple first conductive members 51.

Memory transistors are formed at the crossing portions between the columnar member SP and each of the multiple first conductive members 51. A memory portion MU is formed of the multiple first conductive members 51 and the columnar member SP.

In the example as shown in FIG. 9A and FIG. 9B, the columnar member SP includes a core portion 29. The core portion 29 includes, for example, silicon oxide. The core portion 29 extends along the Z-axis direction through the first stacked body 15a. The first semiconductor member 21 that has a tubular configuration is provided around the core portion 29. The first stacked member 41 that has a tubular configuration is provided around the first semiconductor member 21 having the tubular configuration. The first stacked body 15a is provided around the first stacked member 41 having the tubular configuration.

In the example as shown in FIG. 8, the first stacked body 15a is provided at an upper surface 10a of a base body 10. The base body 10 includes, for example, a silicon substrate.

A silicon oxide film 11 is provided between the base body 10 and the first stacked body 15a. Inter-layer insulating films 12 and electrode films 13 are provided alternately along the Z-axis direction between the silicon oxide film 11 and the first stacked body 15a. Other inter-layer insulating films 12 and other electrode films 13 are further provided alternately along the Z-axis direction on the first stacked body 15a. The columnar member SP extends along the Z-axis direction through the inter-layer insulating films 12, the electrode films 13, the other inter-layer insulating films 12, and the other electrode films 13.

The electrode films 13 function as a lower select gate line SGS. A lower select gate transistor STS is formed at the crossing portion between the lower select gate line SGS and the columnar member SP.

The other electrode films 13 recited above function as an upper select gate line SGD. An upper select gate transistor STD is formed at the crossing portion between the upper select gate line SGD and the columnar member SP.

As described above, memory transistors (memory cells) are formed at the crossing portions between the columnar member SP and the multiple first conductive members 51. The multiple memory transistors are connected in series. The lower select gate transistor STS is connected to one end of the multiple memory transistors connected in series. The upper select gate transistor STD is connected to the other end of the multiple memory transistors connected in series. Thereby, for example, a NAND string is formed.

The multiple first conductive members 51 function as, for example, word electrodes WL (e.g., control electrodes).

A source electrode plate 17 is provided in the semiconductor memory device 130. A source line 61 and multiple bit lines 62 that extend in the Y-axis direction are provided on the first stacked body 15a. The source line 61 is provided higher than the bit lines 62. The source line 61 is connected to the upper end of the source electrode plate 17 via a connection portion 64. The bit lines 62 are connected to the upper ends of the columnar members SP via connection portions 63. A current path of the bit line 62-connection portion 63-columnar member SP-base body 10-source electrode plate 17-connection portion 64-source line 61 is formed. One of the multiple columnar members SP is electrically connected between one bit line 62 and one source line 61.

An insulating member 19 that extends in the X-axis direction is provided in the upper portion of the first stacked body 15a. The insulating member 19 divides the electrode films 13 used as the upper select gate line SGD into two in the Y-axis direction. The insulating member 19 includes, for example, silicon oxide.

The first stacked member 41 recited above is applied to the semiconductor memory device 130. A semiconductor memory device is provided in which the storage density can be increased.

Figure 10:
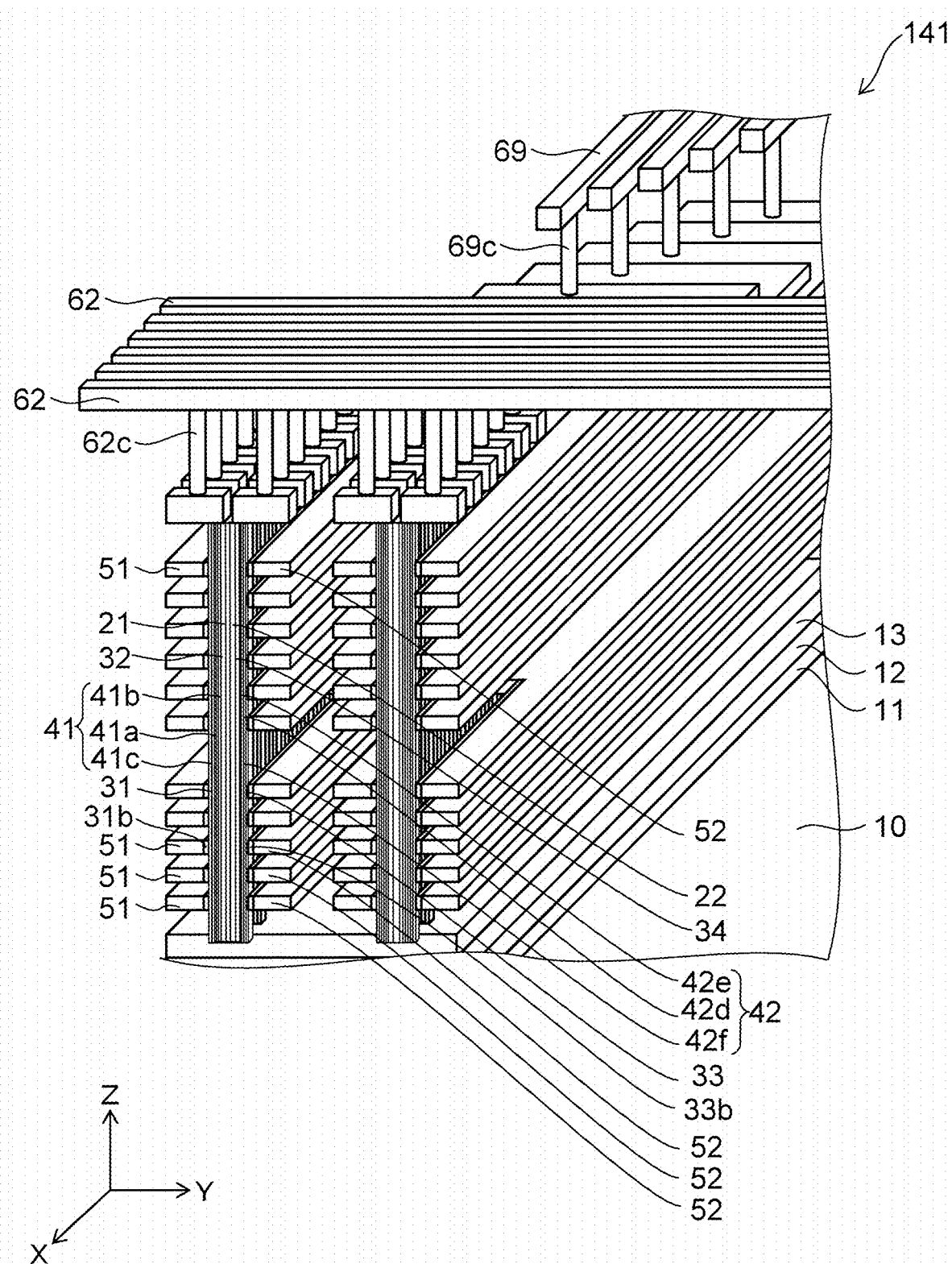
FIG. 10 is a schematic perspective view illustrating a semiconductor memory device according to the third embodiment.

FIG. 10 is a schematic perspective view illustrating a semiconductor memory device according to the third embodiment.

In the semiconductor memory device 131 according to the embodiment as shown in FIG. 10, a second stacked body 15b, a second semiconductor member 22, and a second stacked member 42 are provided in addition to the first stacked body 15a, the first semiconductor member 21, and the first stacked member 41. As described above, the first stacked body 15a includes the multiple first conductive members 51. The multiple first conductive members 51 are separated from each other in the second direction (e.g., the Z-axis direction). The first stacked member 41 is provided between the first semiconductor member 21 and the multiple first conductive members 51. The first semiconductor member 21 and the first stacked member 41 extend along the Z-axis direction through the first stacked body 15a including the multiple first conductive members 51.

The first semiconductor member 21 is provided between the first stacked body 15a and the second stacked body 15b in the first direction (the X-axis direction). The position in the first direction (the X-axis direction) of the second semiconductor member 22 is between the position in the first direction of the first semiconductor member 21 and the position in the first direction of the second stacked body 15b.

The second stacked member 42 is provided between the second stacked body 15b and the second semiconductor member 22 in the first direction (the X-axis direction).

The second stacked member 42 includes a third insulating film 33, a fourth insulating film 34, a fourth layer 42d, and a fifth layer 42e. The fourth insulating film 34 is provided between the third insulating film 33 and the second semiconductor member 22. The fourth layer 42d is provided between the third insulating film 33 and the fourth insulating film 34 and includes aluminum and nitrogen. The fourth thickness of the fourth layer 42d along the direction (e.g., the X-axis direction) from the second semiconductor member 22 toward one of multiple second conductive members 52 is 3 nm or less. The fifth layer 42e is provided between the fourth layer 42d and the fourth insulating film 34 and includes silicon and nitrogen.

In the example, the second stacked member 42 further includes a sixth layer 42f. The sixth layer 42f is provided between the third insulating film 33 and the fourth layer 42d and includes silicon and nitrogen.

In the example, an insulating film 33b is provided between the second conductive member 52 and the third insulating film 33.

The configuration described in reference to the first stacked body 15a is applicable to the second stacked body 15b.

The configuration described in reference to the first semiconductor member 21 is applicable to the second semiconductor member 22. The configuration described in reference to the first insulating film 31 is applicable to the third insulating film 33. The configuration described in reference to the second insulating film 32 is applicable to the fourth insulating film 34. The configuration described in reference to the first stacked member 41 is applicable to the second stacked member 42. The configurations described in reference to the first to third layers 41a to 41c are applicable respectively to the fourth to sixth layers 42d to 42f. The configuration described in reference to the insulating film 31b is applicable to the insulating film 33b.

The multiple first conductive members 51 and the multiple second conductive members 52 are electrically connected to word lines 69 via connection portions 69c. The first semiconductor member 21 is electrically connected to one of the multiple bit lines 62 via a connection portion 62c. The second semiconductor member 22 is electrically connected to another one of the multiple bit lines 62 via another connection portion 62c.

The first stacked member 41 recited above is applied to the semiconductor memory device 131. A semiconductor memory device is provided in which the storage density can be increased.

Fourth Embodiment

The embodiment relates to a method for manufacturing a semiconductor memory device.

FIG. 11 is a flowchart illustrating the method for manufacturing the semiconductor memory device according to the fourth embodiment.

As shown in FIG. 11, one of the first conductive member 51 or the first semiconductor member 21 is formed (step S110). For example, the first conductive member 51 is formed. After the formation of the one recited above (step S110), the first stacked member 41 is formed (step S120). After the formation of the first stacked member 41 (step S120), the other of the first conductive member 51 or the first semiconductor member is formed (step S130). For example, the first semiconductor member 21 is formed.

For example, the first insulating film 31, etc., may be formed between step S110 and step S120. For example, the second insulating film 32, etc., may be formed between step S120 and step S130.

The formation of the first stacked member 41 (step S120) includes the formation of the first layer 41a and the formation of the second layer 41b.

FIG. 12A and FIG. 12B are schematic cross-sectional views illustrating the method for manufacturing the semiconductor memory device according to the fourth embodiment.

In one example as shown in FIG. 12A, the first insulating film 31 is formed on the first conductive member 51. The first layer 41a is formed on the first insulating film 31. The first layer 41a includes aluminum and nitrogen and has a thickness of 3 nm or less.

Further, the second layer 41b is formed continuously with the formation of the first layer 41a. The second layer 41b includes silicon and nitrogen and contacts the first layer 41a.

As shown in FIG. 12B, for example, the second insulating film 32 is formed; and the first semiconductor member 21 is formed.

In the embodiment, the formation of the second layer 41b is performed continuously with the formation of the first layer 41a. Thereby, the incorporation of oxygen into the interface portion between the first layer 41a and the second layer 41b is suppressed. For example, a wide window ΔV1 is obtained.

In the embodiment, the formation of the first layer 41a is performed in a first chamber; and the formation of the second layer 41b also is performed in the first chamber. For example, the formation of these layers is performed using a CVD apparatus.

For example, the formation of the first layer 41a is performed using ammonia and at least one selected from the group consisting of trimethyl aluminum and aluminum trichloride.

For example, the formation of the second layer 41b is performed using ammonia and at least one selected from the group consisting of dichlorosilane, hexachlorodisilane, and tetrachlorosilane.

In the embodiment, the first conductive portion 51a includes, for example, at least one selected from the group consisting of tungsten, molybdenum, and chrome. The second conductive portion 51b includes, for example, at least one selected from the group consisting of TiN and TaN.

According to the embodiment, a band structure is formed in the first layer 41a by the combination of the first layer 41a and the second layer 41b. The trapping efficiency of the trap sites in the first layer 41a can be increased. For example, the threshold window can be enlarged.

According to the embodiments, a semiconductor memory device and a method for manufacturing the semiconductor memory device can be provided in which the characteristics can be stabilized.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in semiconductor memory devices such as conductive members, semiconductor members, stacked members, insulating films, layers, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all semiconductor memory devices, and methods for manufacturing the same practicable by an appropriate design modification by one skilled in the art based on the semiconductor memory devices, and the methods for manufacturing the same described above as embodiments of the invention also are within the scope of the invention to the extent that the purport of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor memory device, comprising:
   a first conductive member;
   a first semiconductor member; and
   a first stacked member provided between the first conductive member and the first semiconductor member,
   the first stacked member including
      a first insulating film,
      a second insulating film provided between the first insulating film and the first semiconductor member,
      a first layer including aluminum and nitrogen and being provided between the first insulating film and the second insulating film, a first thickness of the first layer along a first direction being 3 nm or less, the first direction being from the first semiconductor member toward the first conductive member, and
      a second layer contacting the first layer, including silicon and nitrogen, and being provided at one of a position between the first layer and the second insulating film or a position between the first layer and the first insulating film.

2. The device according to claim 1, wherein an intermediate region does not include oxygen or has a concentration of oxygen lower than a concentration of oxygen in the first insulating film, the intermediate region including a boundary between the first layer and the second layer.

3. The device according to claim 2, wherein the concentration of oxygen in the intermediate region is lower than a concentration of oxygen in the second insulating film.

4. The device according to claim 1, wherein the first thickness is 2 nm or less.

5. The device according to claim 1, wherein at least a portion of the first layer is amorphous.

6. The device according to claim 1, wherein at least a portion of the second layer is amorphous.

7. The device according to claim 1, wherein
   the first stacked member further includes a third layer, and
   the third layer includes silicon and nitrogen and is provided at the other of the position between the first layer and the second insulating film or the position between the first layer and the first insulating film.

8. The device according to claim 7, wherein at least a portion of the third layer is amorphous.

9. The device according to claim 1, wherein the second layer further includes aluminum.

10. The device according to claim 9, wherein an Al composition ratio in the second layer decreases in a direction from the first layer toward the second layer.

11. The device according to claim 1, wherein
    a plurality of the first conductive members are provided,
    the plurality of first conductive members are mutually-separated in a second direction crossing the first direction, and
    the first stacked member is provided between the first semiconductor member and the plurality of first conductive members.

12. The device according to claim 11, wherein the first semiconductor member and the first stacked member extend along the second direction through a first stacked body including the plurality of first conductive members.

13. The device according to claim 12, further comprising:
    a second stacked body including a plurality of second conductive members mutually-separated along the second direction;
    a second semiconductor member; and
    a second stacked member,
    the first semiconductor member being provided between the first stacked body and the second stacked body in the first direction,
    a position in the first direction of the second semiconductor member being between a position in the first direction of the first semiconductor member and a position in the first direction of the second stacked body,
    the second stacked member being provided between the second stacked body and the second semiconductor member in the first direction,
    the second stacked member including
       a third insulating film,
       a fourth insulating film provided between the third insulating film and the second semiconductor member,
       a fourth layer including aluminum and nitrogen and being provided between the third insulating film and the fourth insulating film, a fourth thickness of the fourth layer along a direction being 3 nm or less, the direction being from the second semiconductor member toward one of the plurality of second conductive members, and
       a fifth layer including silicon and nitrogen and being provided at one of a position between the fourth layer and the fourth insulating film or a position between the third insulating film and the fourth layer.

14. The device according to claim 13, wherein
    the second stacked member further includes a sixth layer, and
    the sixth layer includes silicon and nitrogen and is provided at the other one of the position between the fourth layer and the fourth insulating film or the position between the third insulating film and the fourth layer.

15. The device according to claim 1, wherein a second thickness along the first direction of the second layer is not less than 1 nm and not more than 4 nm.

\* \* \* \* \*